(12) United States Patent
Asao

(10) Patent No.: US 6,882,563 B2
(45) Date of Patent: Apr. 19, 2005

(54) MAGNETIC MEMORY DEVICE AND METHOD FOR MANUFACTURING THE SAME

(75) Inventor: Yoshiaki Asao, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 10/305,984

(22) Filed: Nov. 29, 2002

(65) Prior Publication Data

US 2003/0103393 A1 Jun. 5, 2003

(30) Foreign Application Priority Data

Nov. 30, 2001 (JP) .................................... 2001-366933

(51) Int. Cl.$^7$ ......................... G11C 11/00; G11C 11/14; G11C 11/15
(52) U.S. Cl. ..................... 365/158; 365/171; 365/173
(58) Field of Search .............................. 365/158, 171, 365/173; 438/3; 257/421

(56) References Cited

U.S. PATENT DOCUMENTS

| | | | | |
|---|---|---|---|---|
| 5,627,704 | A | | 5/1997 | Lederman et al. .......... 360/113 |
| 5,734,606 | A | | 3/1998 | Tehrani et al. .............. 365/171 |
| 5,978,257 | A | | 11/1999 | Zhu et al. .................... 365/173 |
| 6,473,336 | B1 | * | 10/2002 | Nakajima et al. .......... 365/158 |
| 6,590,244 | B1 | * | 7/2003 | Asao et al. ................. 257/421 |
| 6,611,405 | B1 | * | 8/2003 | Inomata et al. ............. 365/173 |
| 6,683,802 | B1 | * | 1/2004 | Katoh ......................... 365/171 |
| 6,689,622 | B1 | * | 2/2004 | Drewes ........................... 438/3 |
| 6,709,942 | B1 | * | 3/2004 | Pan et al. ....................... 438/3 |
| 6,713,802 | B1 | * | 3/2004 | Lee ................................ 438/3 |

FOREIGN PATENT DOCUMENTS

KR   1998-24995   7/1998

OTHER PUBLICATIONS

Roy Scheuerlein, et al., "A 10ns Read and Write Non–Volatile Memory Array Using a Magnetic Tunnel Junction and FET Switch in Each Cell", ISSCC 2000, Technical Digest, Session 7, pp. 128–129.

* cited by examiner

Primary Examiner—Trong Phan
(74) Attorney, Agent, or Firm—Oblon, Spivak, McClelland, Maier & Neustadt, P.C.

(57) ABSTRACT

A magnetic memory device includes a first memory portion, the first memory portion having a first wiring extending in a first direction, second wirings extending in a second direction, a first memory element portion in which magneto-resistance elements is connected in series and arranged at intersections between the first and second wirings, and a first switching element connected to one end of the first memory element portion, and a second memory portion which is adjacent to the first memory portion in the first direction and shares the first wiring with the first memory portion, the second memory portion having the first wiring, third wirings extending in the second direction, a second memory element portion in which the magneto-resistance elements are connected in series and arranged at intersections between the first and third wirings, and a second switching element connected to one end of the second memory element portion.

30 Claims, 17 Drawing Sheets

MAGNETIC MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2001-366933, filed Nov. 30, 2001, the entire contents of which are incorporated herein by reference.

BACKGROUND OF THE INVENTION

1. Field of the Invention

The invention relates generally to a magnetic memory device and a method for manufacturing the memory device. This invention relates more particularly to a magnetic random access memory (MRAM) wherein a memory cell is formed using a magnetic tunnel junction (MTJ) element that stores information "1" or "0" on the basis of a tunneling magneto-resistive (TMR) effect.

2. Description of the Related Art

In these years, many kinds of memories that store information based on new principles have been proposed. One of them is a magnetic random access memory (MRAM) using a tunneling magneto-resistive (TMR) effect. The MRAM is disclosed, for example, in ISSCC2000 Technical Digest, p. 128, Roy Scheuerlein et al., "A 10 ns Read and Write Non-Volatile Memory Array Using a Magnetic Tunnel junction and FET Switch in Each Cell".

FIGS. 22A, 22B, and 22C are cross-sectional views of a magnetic tunnel junction (MTJ) element of a prior-art magnetic memory device. The MTJ element used as a memory element of the MRAM will now be described.

As is shown in FIG. 22A, an MTJ element 30 has such a structure that an insulating layer (tunnel junction layer) 42 is interposed between two magnetic layers (ferromagnetic layers) 41 and 43. In the MRAM, the MTJ element 30 stores information "1" or "0". The information "1" or "0" is determined on the basis of whether the directions of magnetization of the two magnetic layers 41 and 43 in the MTJ element 30 are parallel or anti-parallel. The term "parallel" in this context means that the directions of magnetization of two magnetic layers 41 and 43 are the same, and "anti-parallel" means that the directions of magnetization of two magnetic layers 41 and 43 are opposite to each other.

Specifically, when the directions of magnetization of two magnetic layers 41 and 43 are parallel, as shown in FIG. 22B, the tunnel resistance of the insulating layer 42 interposed between the two magnetic layers 41 and 43 takes a minimum value. This state corresponds to, for example, "1". On the other hand, when the directions of magnetization of two magnetic layers 41 and 43 are anti-parallel, as shown in FIG. 22C, the tunnel resistance of the insulating layer 42 interposed between the two magnetic layers 41 and 43 takes a maximum value. This state corresponds to, for example, "0".

Normally, an anti-ferromagnetic layer 103 is provided on one of the two magnetic layers 41 and 43. The anti-ferromagnetic layer 103 is a member for fixing the direction of magnetization of one magnetic layer 41, thus permitting easy rewriting of information by merely changing the direction of magnetization of the other magnetic layer 43 alone.

FIG. 23 shows MTJ elements arranged in a matrix in a prior-art magnetic memory device. FIG. 24 shows asteroid curves in the prior-art magnetic memory device. FIG. 25 shows hysteresis curves in the prior-art magnetic memory device. The principle of the write operation for the MTJ element will now be described in brief.

As is shown in FIG. 23, MTJ elements 30 are arranged at intersections between write word lines 22 and bit lines (data select lines) 35, which are arranged to cross each other. A data write operation is performed by supplying a current to each of the write word lines 22 and bit lines 35 and setting the directions of magnetization of the MTJ elements 30 in a parallel state or an anti-parallel state, making use of magnetic fields produced by the current flowing in both lines 22 and 35.

For example, in the data write mode, the bit lines 35 are supplied with only a current I1 that flows in one direction, and the write word lines 22 are supplied with a current I2 that flows in one direction or a current I3 that flows in the other direction in accordance with data to be written. When the write word line 22 is supplied with the current I2 that flows in the one direction, the direction of magnetization of the MTJ element 30 is parallel ("1" state). On the other hand, when the write word line 22 is supplied with the current I3 that flows in the other direction, the direction of magnetization of the MTJ element 30 is anti-parallel ("0" state).

How the direction of magnetization of the MTJ element 30 is changed will now be described. When a current is supplied to a selected write word line 22, a magnetic field Hx occurs in a longitudinal direction, i.e. an Easy-Axis direction, of the MTJ element 30. When a current is supplied to a selected bit line 35, a magnetic field Hy occurs in a transverse direction, i.e. a Hard-Axis direction, of the MTJ element 30. As a result, a composite magnetic field of the Easy-Axis magnetic field Hx and Hard-Axis magnetic field Hy acts on the MTJ element 30 located at the intersection of the selected write word line 22 and selected bit line 35.

In a case where the magnitude of the composite magnetic field of the Easy-Axis magnetic field Hx and Hard-Axis magnetic field Hy is in an outside region (hatched region) of asteroid curves indicated by solid lines in FIG. 24, the direction of magnetization of the magnetic layer 43 can be reserved. On the other hand, when the magnitude of the composite magnetic field of the Easy-Axis magnetic field Hx and Hard-Axis magnetic field Hy is in an inside region (blank region) of the asteroid curves, the direction of magnetization of the magnetic layer 43 cannot be reversed.

In addition, as indicated by solid and broken lines in FIG. 25, the magnitude of the Easy-Axis magnetic field Hx, which is necessary for varying the resistance value of the MTJ element 30, varies with the magnitude of the Hard-Axis magnetic field Hy. Making use of this phenomenon, the direction of magnetization of only the MTJ element 30 located at the intersection of the selected write word line 22 and selected bit line 25, among the arrayed memory cells, is altered, and thus the resistance value of the MTJ element 30 can be varied. Oe in FIG. 25 is an abbreviation of "oersted" and unit of a magnetic field.

A variation ratio in resistance value of the MTJ element 30 is expressed by an MR (Magneto-Resistive) ratio. For example, if the magnetic field Hx is produced in the Easy-Axis direction, the resistance value of the MTJ element 30 varies, e.g. about 17%, compared to the state before the production of magnetic field Hx. In this case, the MR ratio is 17%. The MR ratio varies corresponding to the properties of the magnetic layer. At present, MTJ elements with an MR ratio of about 50% have successfully been obtained.

As has been described above, the direction of magnetization of the MTJ element 30 is controlled by varying each of the magnitudes of Easy-Axis magnetic field Hx and Hard-Axis magnetic field Hy and by varying the magnitude of the composite magnetic field of the fields Hx and Hy. In this manner, a state in which the direction of magnetization of the MTJ element 30 is parallel or a state in which the direction of magnetization of the MTJ element 30 is anti-parallel is created, and information "1" or "0" is stored.

FIG. 26 is a cross-sectional view of a prior-art magnetic memory device having a transistor. FIG. 27 is a cross-sectional view of a prior-art magnetic memory device having a diode. An operation of reading out information from the MTJ element will be described below.

Data read-out is effected by supplying a current to a selected MTJ element 30 and detecting the resistance value of the MTJ element 30. The resistance value is varied by applying a magnetic field to the MTJ element 30. The varied resistance value is read out by the following method.

In the example shown in FIG. 26, a MOSFET 14 is used as a switching element for data read-out. As is shown in FIG. 26, an MTJ element 30 is connected in series to, for example, an $N^+$-type source/drain diffusion layer 13 of the MOSFET 14 in one cell. If the gate electrode 12 of the MOSFET 14, which is a chosen one, is turned on, a current path is formed through the following elements in the named order: a bit line 35, the MTJ element 30, a lower electrode 31, a contact 26, a second wiring 22, a contact 18, a first wiring 17, a contact 16, and source/drain diffusion layer 13. Thus, the resistance value of the MTJ element 30, which is connected to the turned-on MOSFET 14, can be read out.

In the example of FIG. 27, a diode 61 is used as a switching element for data read-out. As is shown in FIG. 27, an MTJ element 30 is connected in series to a diode 61 within one cell. The doide 61 is formed of a $P^+$-type diffusion layer and an $N^+$-type diffusion layer. By adjusting a bias voltage so as to cause a current to flow to the diode 61, which is a chosen one, the resistance value of the MTJ element 30 connected to the diode 61 can be read out. In FIGS. 26 and 27, an element-isolating region of a STI (shallow trench isolation) structure is formed in a P-type semiconductor substrate 11. A word line 22 is formed below the MTJ element 30.

If the resistance value, which has been read out as described above, is low, it is determined that information "1" has been written. If the resistance value is high, it is determined that information "0" has been written.

In the above-mentioned prior-art magnetic memory device, however, there are one MTJ element 30 and one switching element in each cell as shown in FIGS. 26 and 27, so that an memory cell array region occupies a large area within this magnetic memory device.

BRIEF SUMMARY OF THE INVENTION

It is an object of the invention to provide a magnetic memory device according to a first aspect of the invention which comprises: a first memory portion which includes a first wiring extending in a first direction, a plurality of second wirings extending in a second direction different from the first direction, a first memory element portion in which a plurality of magneto-resistance elements is connected in series and arranged between the first wiring and the second wirings at intersections therebetween as separated therefrom respectively, and a first switching element connected to one end of the first memory element portion; and a second memory portion which is adjacent to the first memory portion in the first direction and shares the first wiring with the first memory portion and also which includes the first wiring, a plurality of third wirings extending in the second direction, a second memory element portion in which the magneto-resistance elements are connected in series and arranged between the first wiring and the third wirings at intersections therebetween as separated therefrom respectively, and a second switching element connected to one end of the second memory element portion.

It is another object of the invention to provide a magnetic memory device manufacturing method according to a second aspect of the invention which comprises: forming a first switching element on a semiconductor substrate; forming a plurality of first wirings extending in a first direction above the semiconductor substrate; forming a first insulation film on the first wirings; forming a first memory element portion in which a plurality of magneto-resistance elements is connected in series on the first insulation film above the first wirings, to connect one end of the first memory element portion to the first switching element; forming a second insulation film on the first memory element portion; and forming a second wiring extending in a second direction different from the first direction on the second insulation film above the first memory element portion.

DETAILED DESCRIPTION OF THE INVENTION

The embodiments of the invention relate to a magnetic random access memory (MRAM) using a magnetic tunnel junction (MTJ) element utilizing the tunneling magneto-resistive (TMR) effect.

The following will describe the embodiments of the invention with reference to drawings. In the description, common components are indicated by common reference symbols all over the drawings.

First Embodiment

A first embodiment employs a structure in which a plurality of MTJ elements arranged below one bit line is connected in series.

Figure 1:
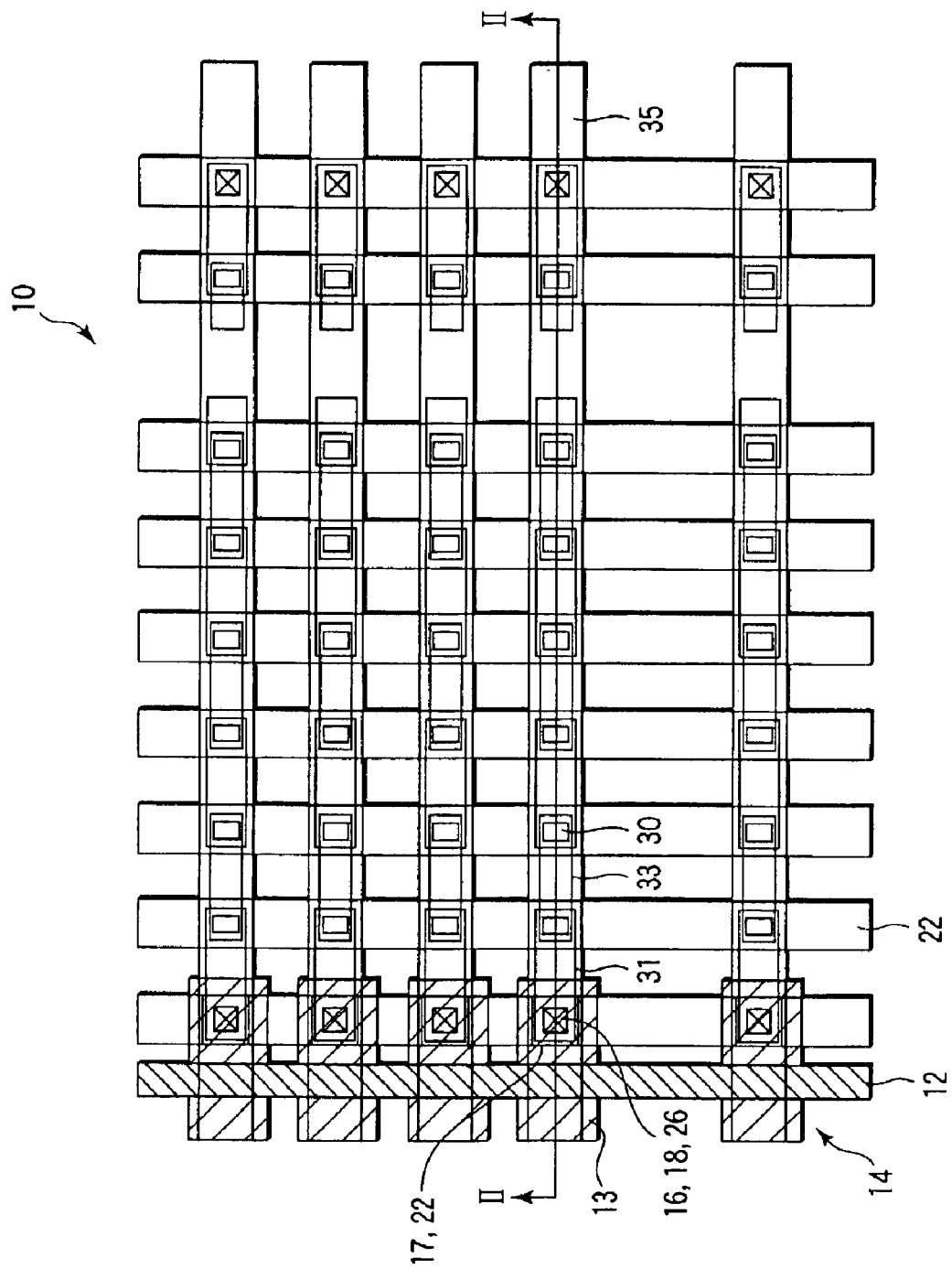
FIG. 1 is a plan view for showing a magnetic memory device related to a first embodiment of the invention.
Figure 2:
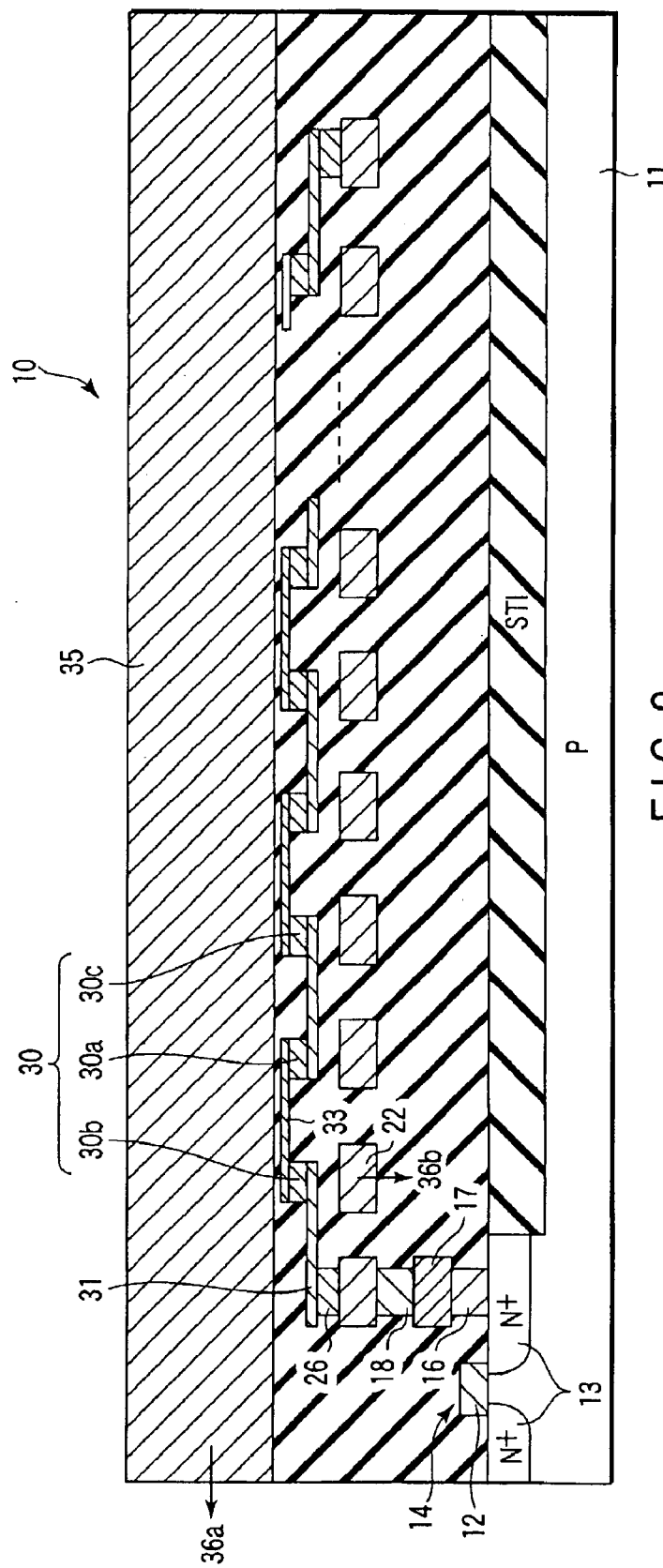
FIG. 2 is a cross-sectional view of the magnetic memory device taken along line II—II of FIG. 1.
Figure 3:
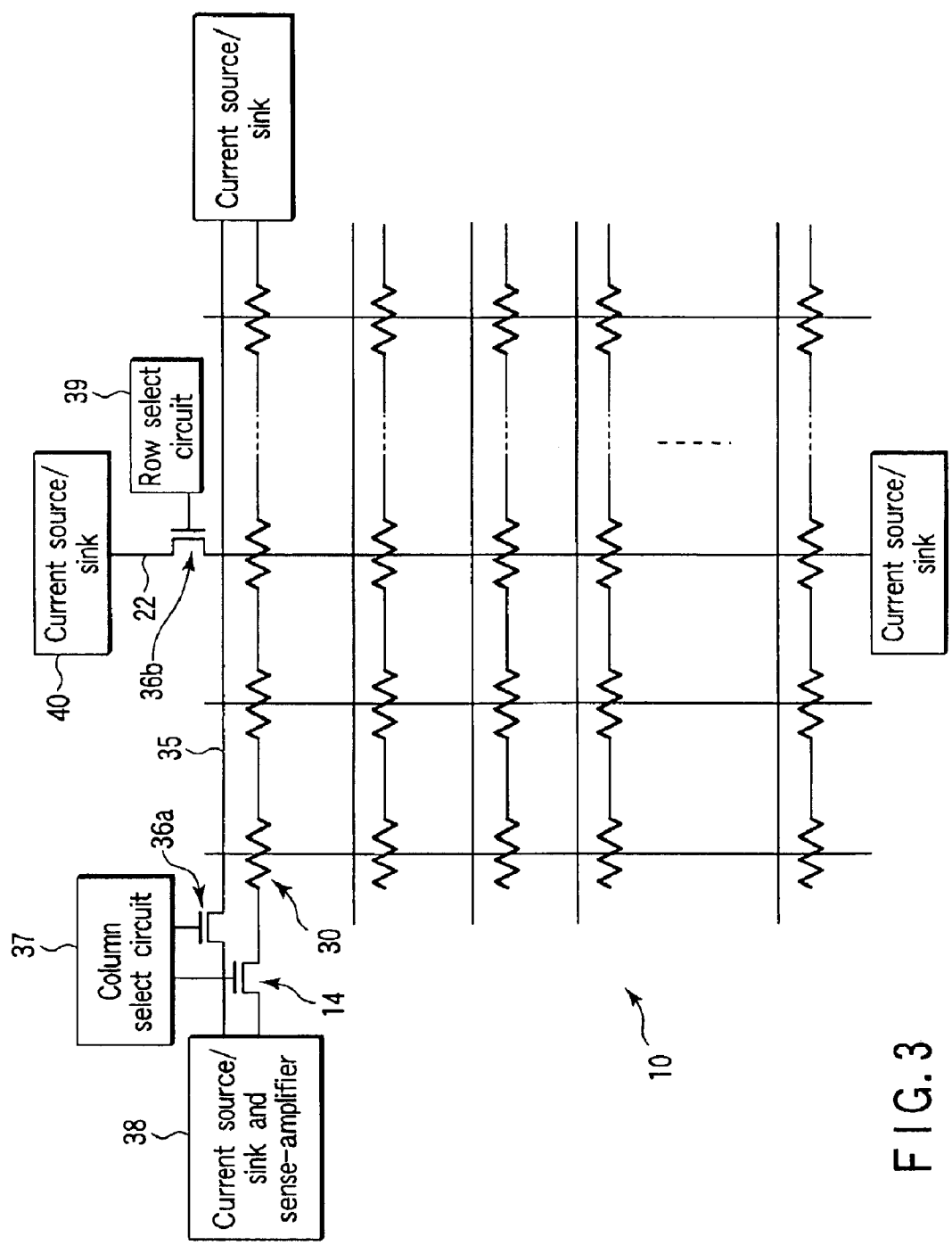
FIG. 3 is a schematic circuit diagram for showing the magnetic memory device related to the first embodiment of the invention.

FIG. 1 is a plan view of a magnetic memory device related to the first embodiment of the invention. FIG. 2 is a cross-sectional view of the magnetic memory device taken along line II—II of FIG. 1. FIG. 3 is a schematic circuit diagram of the magnetic memory device related to the first embodiment of the invention. The following will describe the structure of the magnetic memory device related to the first embodiment of the invention.

As shown in FIG. 1, the magnetic memory device related to the first embodiment has MTJ elements 30 each arranged at each of intersections between a plurality of bit lines 35 and a plurality of word lines 22. Of these MTJ elements 30, those MTJ elements 30 that are arranged below one of the bit lines 35 are connected in series. To the terminal one of these serially connected MTJ elements 30 in each column is there connected a MOSFET 14 (hatched region in FIG. 1), which is a read-out switching element. It is to be noted that by the first embodiment, the bit lines 35 and the word lines 22 are arranged so that they may cross each other perpendicularly, thus providing a structure suited for making up a large scale cell array.

Furthermore, as shown in FIG. 2, the MTJ elements 30 serially connected in parallel with the surface of, for example, a P-type semiconductor substrate 11 are arranged between the bit lines 35 and the word lines 22 as separated therefrom respectively. In this arrangement, the MTJ elements 30 are connected in series, specifically by interconnecting an upper electrode 33 and a lower electrode 31 alternately. For example, an arbitrary MTJ element 30a is connected to an adjacent MTJ element 30b at the upper electrode 33 and to the other adjacent MTJ element 30c at the lower electrode 31. In addition, the terminal one of the serially connected MTJ elements 30 in each column is connected through contacts 16, 18, and 26 and a wiring 17 to, for example, an N⁺-type source/drain diffusion layer 13 of the MOSFET 14. This MOSFET 14 is arranged at a periphery of a memory cell array region 10, in such a configuration that below each of the MTJ elements 30 in the semiconductor substrate 11 is there present an element-isolating insulation film having, for example, a shallow trench isolation (STI) structure.

In addition, as shown in FIG. 3, at the periphery of the memory cell array region 10 is there arranged a MOSFET 36a connected to each of the bit lines 35. The MOSFETS 14 and 36a are provided to select any one of the bit lines 35 that includes the serially connected MTJ elements 30 and connected to a column select circuit 37 and a current source/sink and sense-amplifier 38. Furthermore, at the periphery of the memory cell array region 10 are there arranged a MOSFET 36b connected to the word line 22 and also a row select circuit 39 and a current source/sink 40 connected thereto. The MOSFET 36b is provided to select any one of the word lines 22.

The MTJ element 30 comprises at least three layers, i.e., a magnetically fixed layer (magnetic pinning layer) whose magnetization direction is fixed, a tunnel junction layer (nonmagnetic layer), and a magnetic recording layer (magnetic free layer) whose magnetization direction is reversible. This MTJ element 30 can have either a single tunnel junction structure comprising a single tunnel junction layer, or a double tunnel junction structure comprising two tunnel junction layers. Examples of the single and double tunnel junction structure will be described below.

Figure 4A:
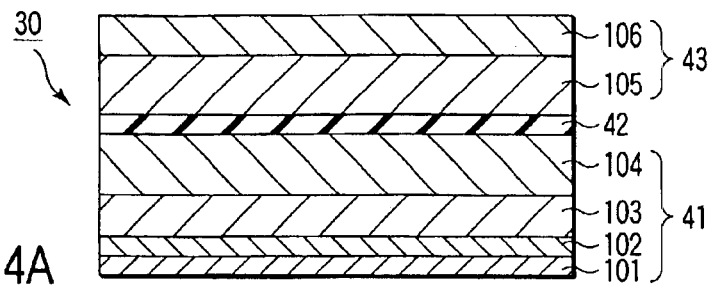
FIGS. 4A and 4B are cross-sectional views for showing a single tunnel junction structure MTJ element related to each of embodiments of the invention.

An MTJ element 30 with the single tunnel junction structure, as shown in FIG. 4A, has a magnetically fixed layer 41, a tunnel junction layer 42 formed on this magnetically fixed layer 41, and a magnetic recording layer 43. The magnetically fixed layer 41 is formed by stacking a template layer 101, an initial ferromagnetic layer 102, an anti-ferromagnetic layer 103, and a reference ferromagnetic layer 104 in this order. The magnetic recording layer 43 is formed by stacking a free ferromagnetic layer 105 and a contact layer 106 in this order on the tunnel junction layer 42.

Figure 4B:
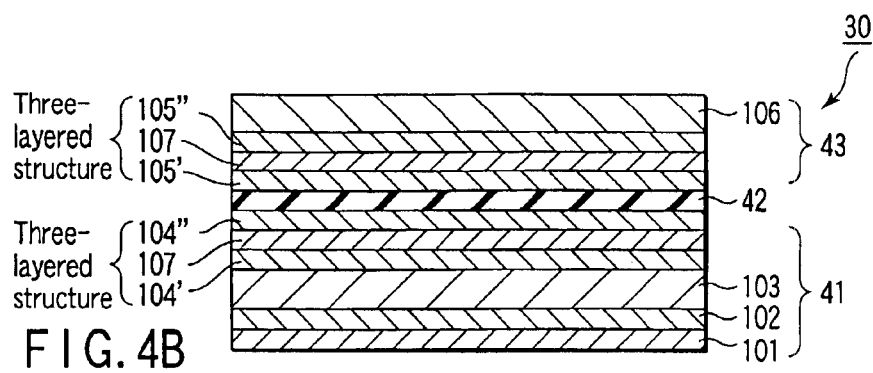

An MTJ element 30 with the single tunnel junction structure, as shown in FIG. 4B, has a magnetically fixed layer 41, a tunnel junction layer 42 formed on this magnetically fixed layer 41, and a magnetic recording layer 43. The magnetically fixed layer 41 is formed by stacking a template layer 101, an initial ferromagnetic layer 102, an anti-ferromagnetic layer 103, a ferromagnetic layer 104', a non-magnetic layer 107, and a ferromagnetic layer 104" in this order. The magnetic recording layer 43 is formed by stacking a ferromagnetic layer 105', a nonmagnetic layer 107, a ferromagnetic layer 105", and a contact layer 106 in this order on the tunnel junction layer 42.

This MTJ element 30 shown in FIG. 4B has a three-layered structure made up of the ferromagnetic layer 104', the nonmagnetic layer 107, and the ferromagnetic layer 104" in the magnetically fixed layer 41 and another three-layered structure made up of the ferromagnetic layer 105', the nonmagnetic layer 107, and the ferromagnetic layer 105" in the magnetic recording layer 43. Accordingly, compared to the MTJ element 30 shown in FIG, 4A, this MTJ element 30 shown in FIG. 4B can more suppress the generation of magnetic poles inside the ferromagnetic layers and provide a cell structure more suited to micropatterning.

Figure 5A:
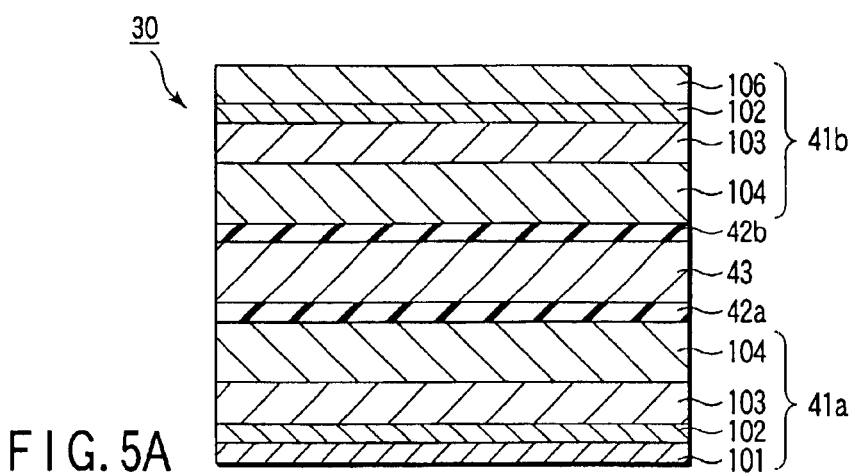
FIGS. 5A and 5B are cross-sectional views for showing a double tunnel junction structure MTJ element related to each of the embodiments of the invention.

An MTJ element 30 with the double tunnel junction structure, as shown in FIG. 5A, has a first magnetically fixed layer 41a, a first tunnel junction layer 42a formed on this first magnetically fixed layer 41a, a magnetic recording layer 43 formed on this first tunnel junction layer 42a, a second tunnel junction layer 42b formed on this magnetic recording layer 43, and a second magnetically fixed layer 41b. The first magnetically fixed layer 41a is formed by stacking a template layer 101, an initial ferromagnetic layer 102, an anti-ferromagnetic layer 103, and a reference ferromagnetic layer 104 in this order. The second magnetically fixed layer 41b is formed by stacking a reference ferromagnetic layer 104, an anti-ferromagnetic layer 103, an initial ferromagnetic layer 102, and a contact layer 106 in this order on the second tunnel junction layer 42b.

Figure 5B:
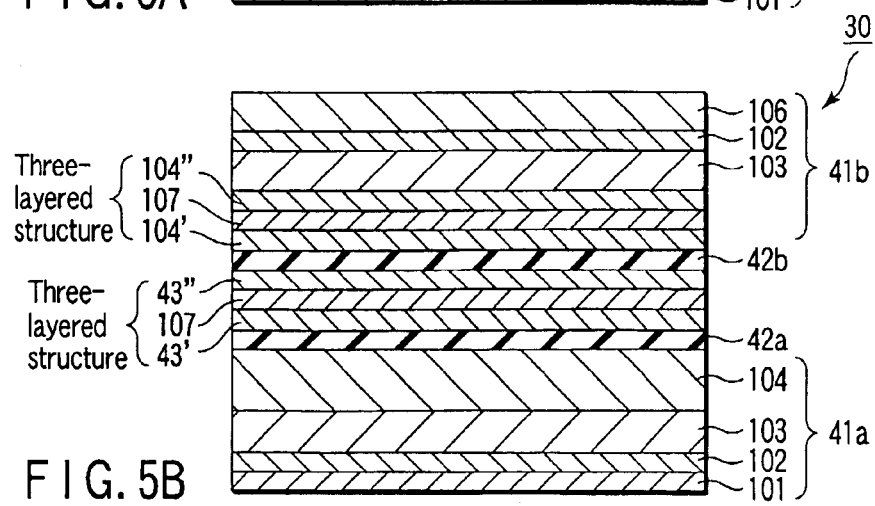

An MTJ element 30 with the double tunnel junction structure, as shown in FIG. 5B, has a first magnetically fixed layer 41a, a first tunnel junction layer 42a formed on this first magnetically fixed layer 41a, a magnetic recording layer 43, a second tunnel junction layer 42b formed on this magnetic recording layer 43, and a second magnetically fixed layer 41b. The first magnetically fixed layer 41a is formed by stacking a template layer 101, an initial ferromagnetic layer 102, an anti-ferromagnetic layer 103, and a reference ferromagnetic layer 104 in this order. The magnetic recording layer 43 is formed by stacking a ferromagnetic layer 43', a nonmagnetic layer 107, and a ferromagnetic layer 43" in this order on the first tunnel junction layer 42a. The second magnetically fixed layer 41b is formed by stacking a reference ferromagnetic layer 104', a nonmagnetic layer 107, a ferromagnetic layer 104", and anti-ferromagnetic layer 103, an initial ferromagnetic layer 102, and a contact layer 106 in this order on the second tunnel junction layer 42b.

This MTJ element 30 shown in FIG. 5B has a three-layered structure made up of the ferromagnetic layer 43', the nonmagnetic layer 107, and the ferromagnetic layer 43" forming the magnetic recording layer 43, and another three-layered structure made up of the ferromagnetic layer 104', the nonmagnetic layer 107, and the ferromagnetic layer 104" in the second magnetically fixed layer 41b. Accordingly, compared to the MTJ element 30 shown in FIG. 5A, this MTJ element 30 shown in FIG. 5B can more suppress the generation of magnetic poles inside the ferromagnetic layers and provide a cell structure more suited to micropatterning.

The double tunnel junction structure MTJ element 30 suffers less deterioration in the MR (Magneto Resistive) ratio (variation in resistance between "1" and "0" states) than the single tunnel junction structure MTJ element 30, when the same external bias is applied. Hence, the double tunnel junction structure MTJ element 30 can operate at a higher bias than the single tunnel junction structure MTJ element 301. This is advantageous in reading out data from a cell.

The single or double tunnel junction structure MTJ element 30 as described above is formed using the following materials.

Preferred examples of the material of the magnetically fixed layers 41, 41a, and 41b and the magnetic recording layer 43 are Fe, Co, Ni, and their alloys, magnetite having a large spin polarizability, oxides such as $CrO_2$ and $RXMnO_{3-y}$ (R; rare earth element, X; Ca, Ba, or Sr), and Heusler alloys such as NiMnSb and PtMnSb. Nonmagnetic elements such as Ag, Cu, Au, Al, Mg, Si, Bi, Ta, B, C, O, N, Pd, Pt, Zr, Ir, W, Mo, and Nb can also be more or less contained in these magnetic substances, provided that ferromagnetism is not lost.

As the material of the anti-ferromagnetic layer 103 forming part of these magnetically fixed layers 41, 41a, and 41b, it is preferable to use Fe—Mn, Pt—Mn, Pt—Cr—Mn, Ni—Mn, Ir—Mn, NiO, or $Fe_2O_3$.

As the material of the tunnel junction layers 42, 42a, and 42b, it is possible to use various dielectric substances such as $Al_2O_3$, $SiO_2$, MgO, AlN, $Bi_2O_3$, $MgF_2$, $CaF_2$, $SrTiO_2$, and $AlLaO_3$. Oxygen, nitrogen, and fluorine deficiencies may be present in these dielectric substances.

FIGS. 6–15 shows cross-sectional views of respective steps of manufacturing a magnetic memory device related to the first embodiment of the invention. The following will describe the steps for manufacturing the magnetic memory device related to the first embodiment.

Figure 6:
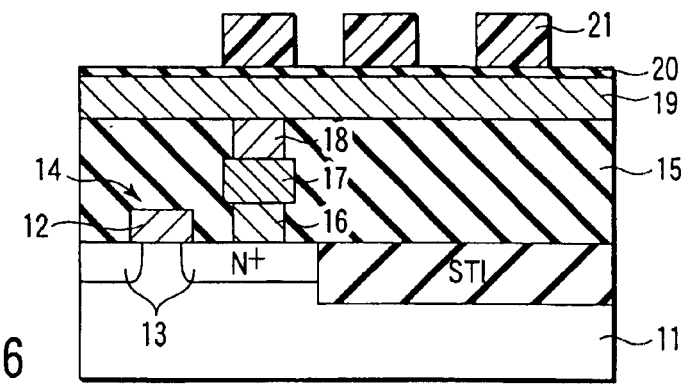
FIGS. 6, 7, 8, 9, 10, 11, 12, 13, 14, and 15 are cross-sectional views for showing respective steps of manufacturing the magnetic memory device related to the first embodiment of the invention.

First, as shown in FIG. 6, on the semiconductor substrate 11, a gate electrode 12 is selectively formed via a gate insulation film (not shown). On the surface of the semiconductor substrate 11, for example , an $N^+$-type source/drain diffusion layer 13 is formed on both sides of the gate electrode 12. In such a manner, a MOS transistor 14 is formed, whose gate electrode 12 acts as a read-out wiring. Next, inside an insulation film 15, a first contact 16 connected to the source/drain diffusion layer 13, a first wiring 17, and a second contact 18 are formed in this order.

Next, by sputtering, a second wiring material layer 19 constituted of, for example, a Ti/TiN/AlCu/Ti/TiN layer is formed on the insulation film 15 and the second contact 18. The film thickness value of these component layers of this second wiring material layer 19 are, for example, 100 Å/Å100 Å/2000 Å/50 Å/400 Å in this order. On this second wiring material layer 19, a SiN film 20 is deposited. This SiN film 20 functions as a stopper film in a chemical mechanical polishing (CMP) processing and has a film thickness of, for example, 300 Å. Next, on the SiN film 20, a photoresist 21 is applied and then formed into a desired pattern through photolithography.

Figure 7:
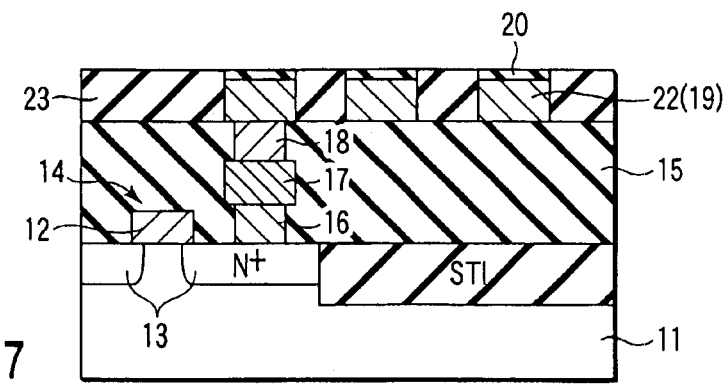

Next, as shown in FIG. 7, the SiN film 20 and the second wiring material layer 19 are removed by reactive ion etching (RIE). In such a manner, a plurality of second wirings 22 is formed. This plurality of wirings 22, which is not connected to the source/drain diffusion layer 13, functions as a write-in word line. Then, the photo-resist 21 is removed, to perform wet processing as a post-processing. Next, on the insulation film 15 and the SiN layer 20, an inter-layer film 23 is formed which is made up of, for example, an HDP-USG (High density Plasma-Undoped Silicate Glass) film and a unit TEOS (Tetra Ethyl Ortho Silicate) film. In this case, the film thickness of the HDP-USG is, for example, 4000 Å, while that of the unit TEOS is, for example, 6500 Å. Next, using the SiN film 20 as a stopper, the inter-layer film 23 is flattened by CMP until the surface of the SiN film 20 is exposed. Then, the SiN film 20 is removed using, for example, $H_3PO_4$.

Figure 8:
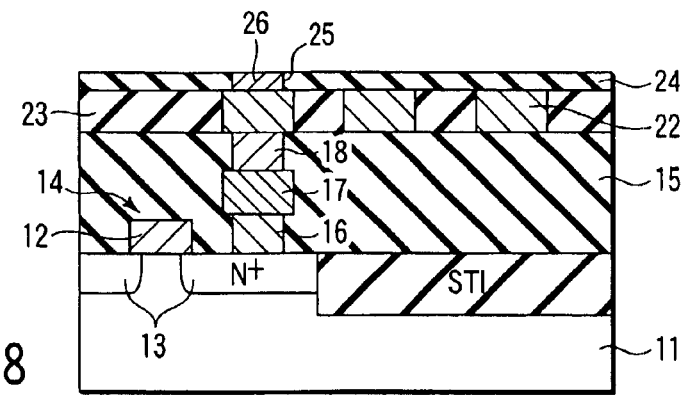

Next, as shown in FIG. 8, an inter-layer film 24 is formed on the inter-layer film 23 and the second wirings 22. Next, a contact hole 25 is selectively formed in the inter-layer film 24 by photolithography and RIE. In this contact hole 25, a barrier metal layer (not shown) constituted of, for example, a TiN layer is deposited by sputtering as thick as, for example, 4000 Å, on which is in turn deposited a W layer by chemical vapor deposition (CVD) as thick as, for example, 100 Å. Then, the barrier metal and the W layer are flattened by CMP until the surface of the inter-layer film 24 is exposed, in which film 24 is formed a contact 26 which connects to the source/drain diffusion layer 13.

Figure 9:
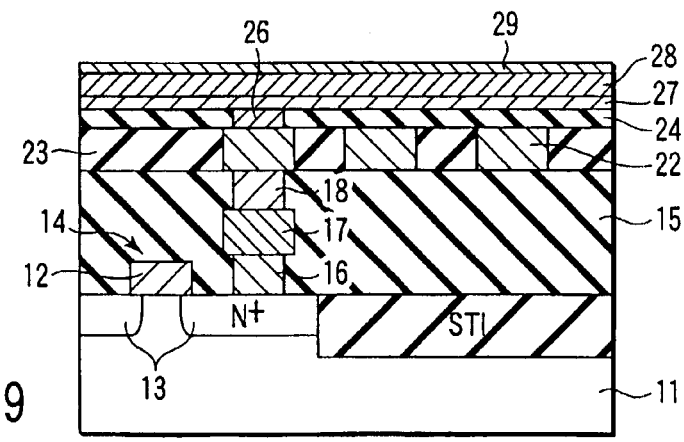

Next, as shown in FIG. 9, on the contact 26 and the insulation film 24, a lower electrode material layer 27 made of W is formed by sputtering as thick as, for example, 500 Å. Then, an MTL material layer 28 is formed by sputtering on the lower electrode material layer 27, on which layer 28 is formed a hard mask 29 made of Ta.

Figure 10:
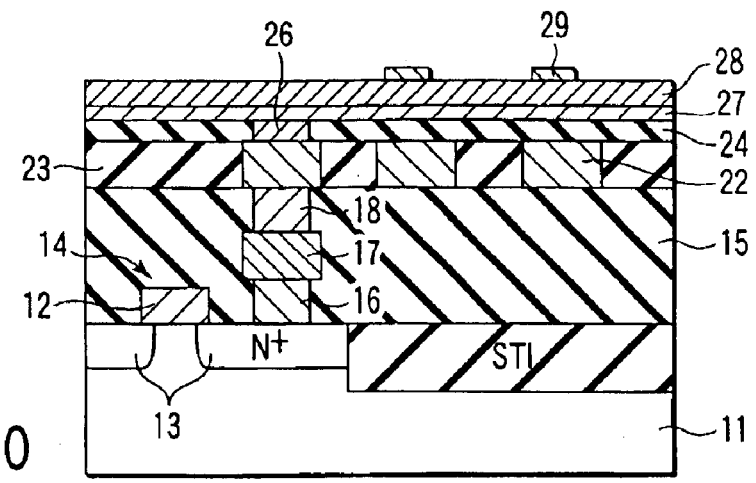

Next, as shown in FIG. 10, a photo-resist (not shown) is applied to the hard mask 29 and formed into a desired pattern by photolithography. Using the photo-resist thus patterned as a mask, the hard mask 29 is formed into a desired pattern by RIE. Then, the photo-resist is removed by ashing.

Figure 11:
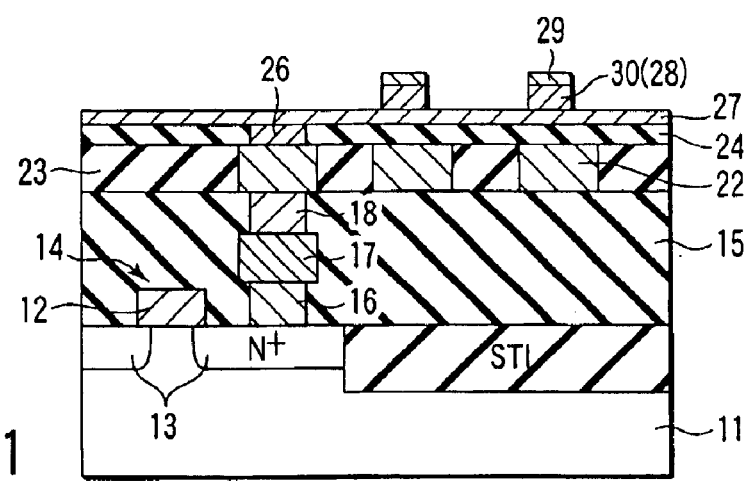

Next, as shown in FIG. 11, using the lower electrode material layer 27 as a stopper, the MTJ material layer 28 is etched by ion milling. In such a manner, a plurality of MTJ elements 30 is formed.

Figure 12:
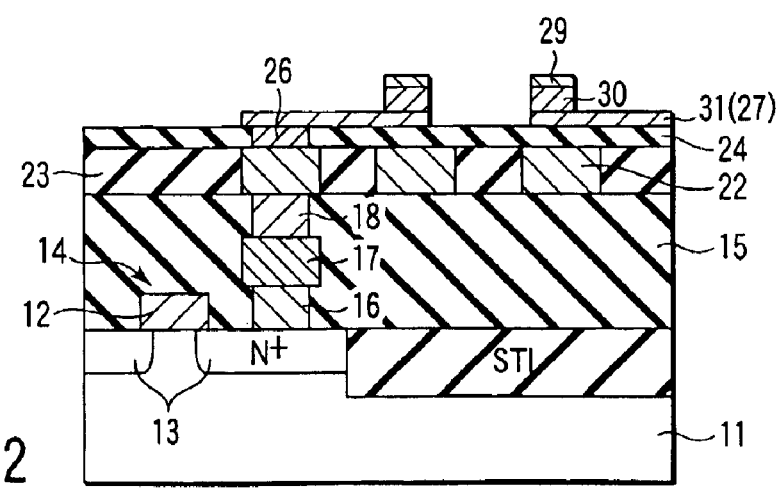

Next, as shown in FIG. 12, the lower electrode material layer 27 is selectively removed by photolithography and RIE, to form a lower electrode 31.

Figure 13:
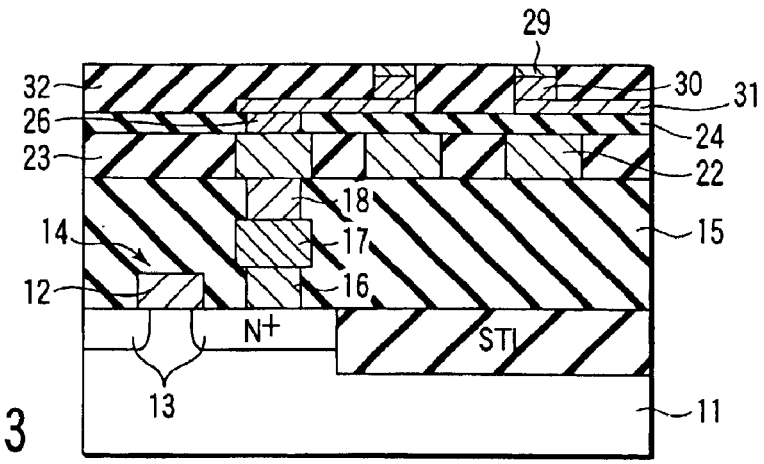

Next, as shown in FIG. 13, an inter-layer film 32 constituted of a spin on glass (SOG) film is formed on the inter-layer film 24, the lower electrode 31, and the hard mask 29. Then, the inter-layer film 32 is flattened by CMP until the surface of the hard mask 29 is exposed. In this CMP processing, the hard mask 29 acts as a stopper.

Figure 14:
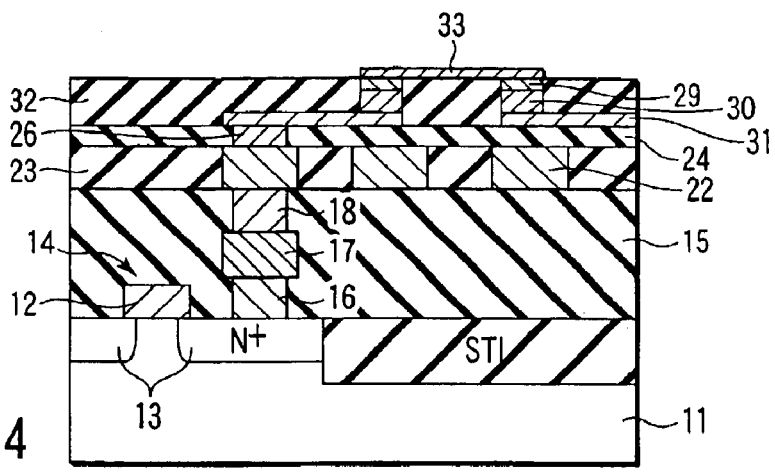

Next, as shown in FIG. 14, an upper electrode material layer is formed on the hard mask 29 and an insulation film 32 by sputtering and then formed into a desired pattern by photolithography and RIE. In such a manner, an upper electrode 33 is formed. This upper electrode 33 or the lower electrode 31 is used to interconnect the mutually adjacent MTJ elements 30.

Figure 15:
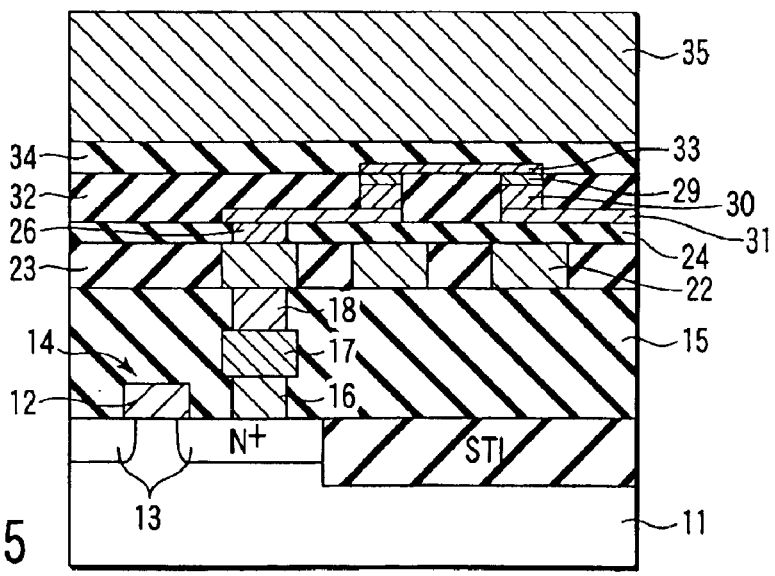

Next, as shown in FIG. 15, an inter-layer film 34 constituted of an SOG film is formed on the upper electrode 33 and the insulation film 32. Next, a via contact (not shown) used in a peripheral circuit is formed and then the bit line 35 is formed.

As described above, in the magnetic memory device related to the first embodiment of the invention, rather than the MOSFET 14 is connected for each MTJ element 30, the plurality of MTJ elements 30 is connected in series, to terminal one of which the MOSFET 14 is connected. Accordingly, one MOSFET 14 is shared by the MTJ elements 30 connected in series. Therefore, data write-in and read-out are performed as follows.

As by a prior art, data is written by selecting one bit line 35 and one word line 22 using address select circuits 37 and 39 respectively and supplying these selected bit line 35 and word line 22 with a current in a certain direction. Thus, the data is written to an MTJ element 30 at an intersection between these selected bit line 35 and word line 22.

Data is read out by turning on the MOSFET 14 to thereby select any given bit line 35 and detecting a series resistance of a column of the MTJ elements connected in series. Therefore, the following sequence different from a conventional one is required.

First, a bit line 35 comprised of a column of the serially connected MTJ elements 30 including an selected MTJ element 30 in which data to be read out has been written is selected and a current is supplied to the column having a serial resistance, to detect a value of a first current flowing through this column having this serial resistance using a sense-amplifier. Then, for example, data "1" is written to the selected MTJ element 30. Subsequently, this bit line 35 is selected again to supply a current again through the column, having the serial resistance, comprised of the serially connected MTJ elements 30 including the selected MTJ element 30, to thereby detect a value of a second current flowing through this column having this serial resistance using the sense-amplifier. Then, the first and second current values are compared to each other. If, as a result, there is detected any variation between the first and second current values, it is found that data "0" has been stored in the selected MTJ element 30. If there is detected no variation between the first and second current values, it is found that data "1" has been stored in it.

If data "0" has been stored beforehand, data destruction has occurred owing to write-in of data "1". Therefore, it is necessary to write in data "0" after the above-mentioned series of operations are performed.

According to the first embodiment, the plurality of MTJ elements 30 is arranged so as to be connected in series below any given bit line 35 and share one MOSFET 14. That is, there is no need to provide the MOSFET 14 for each of the MTJ elements 30, so that an area occupied by the memory cell array 10 can be reduced. Therefore, as compared to a design rule of the memory cell array region 10 of $8F^2$ by the prior art, that of the memory cell array region 10 by the first embodiment is of a small value of $4F^2$+MOSFET.

Second Embodiment

According to a second embodiment, for each bit line is there provided a plurality of memory portions each comprising serially connected MTJ elements and a MOSFET connected to one of these MTJ elements.

Figure 16:
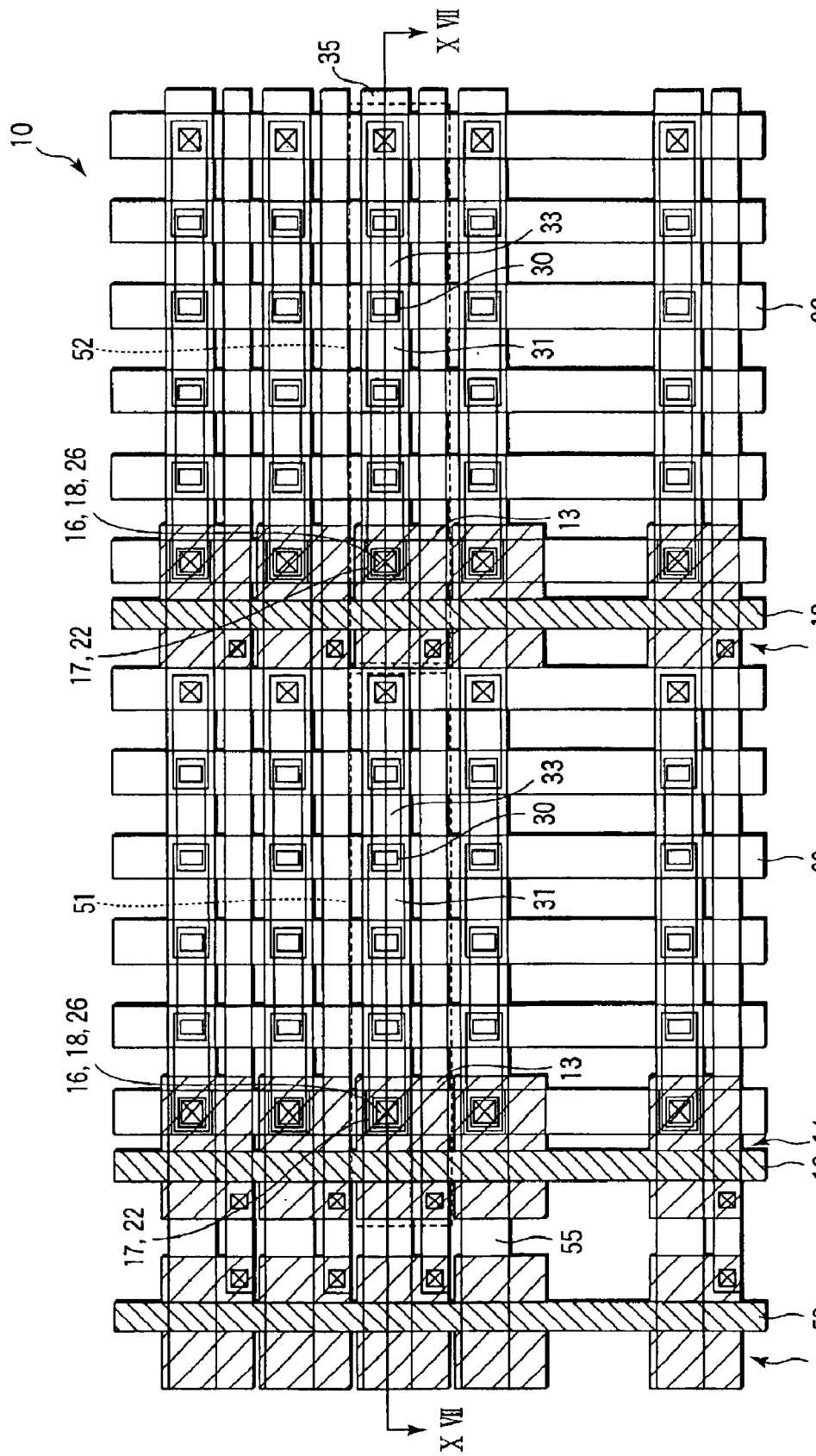
FIG. 16 is a plan view for showing a magnetic memory device related to a second embodiment of the invention.
Figure 17:
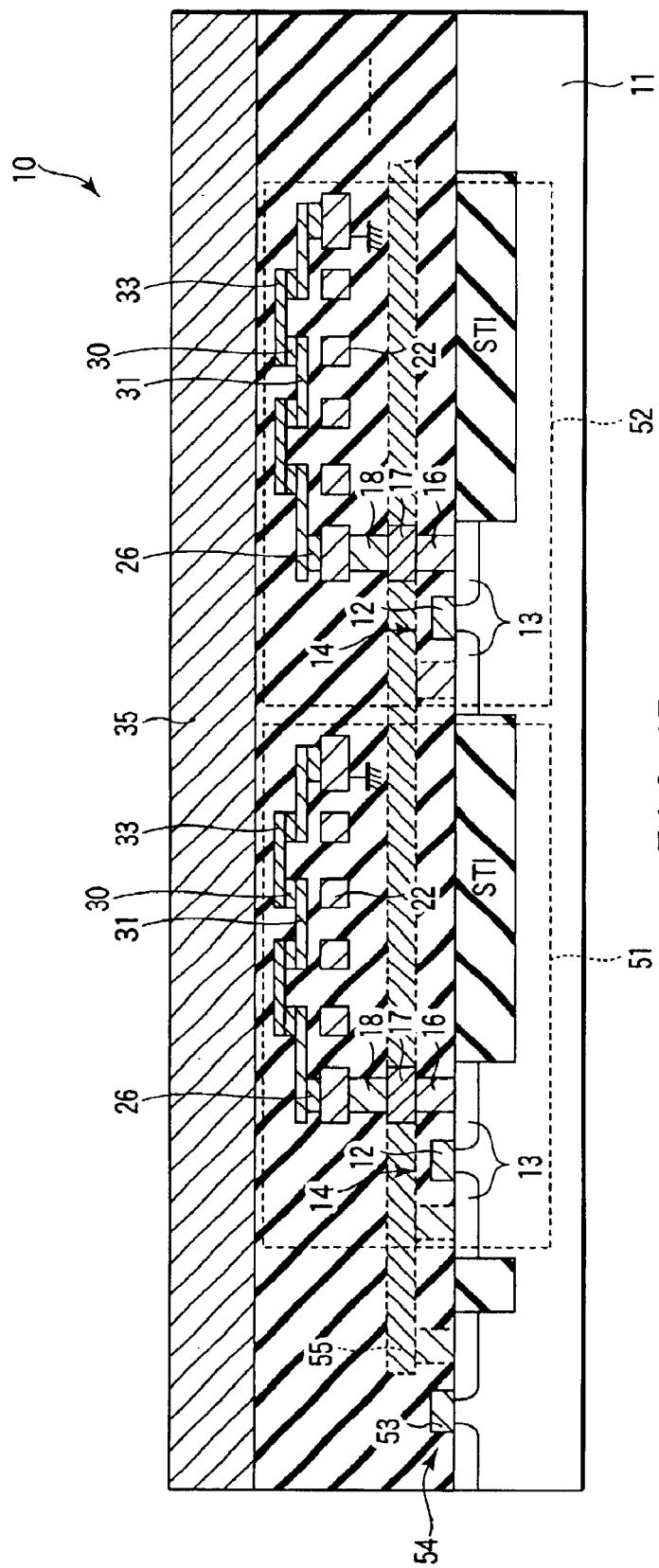
FIG. 17 is a cross-sectional view of the magnetic memory device taken along line XVII—XVII of FIG. 16.

FIG. 16 shows a plan view of a magnetic memory device related to the second embodiment of the invention. FIG. 17 shows a cross-sectional view of the magnetic memory device taken along line XVII—XVII of FIG. 16. The following will describe a structure of the magnetic memory device related to the second embodiment of the invention. It is to be noted that the description of the components of the present embodiment which are similar to those of the first embodiment is omitted.

As shown in FIGS. 16 and 17, the second embodiment differs from the first embodiment in that for each bit line 35 is there provided a plurality of memory portions 51 and a plurality of memory portions 52 each comprising serially connected MTJ elements 30 and a MOSFET 14 connected to a terminal one of these MTJ elements 30. That is, the pluralities of memory portions 51 and 52 share one bit line 35. In each of the memory portions 51 and 52, to a source/drain diffusion layer 13 of the MOSFET 14, a MOSFET 54 arranged at a periphery of a memory cell array region 10 is connected through a wiring 55. The other terminal one of the serially connected MTJ elements 30 is connected to the ground.

According to the second embodiment, it is so designed that when any one of the bit lines 35 is selected, the corresponding MOSFET 14 may be turned on and also that when any one of word lines 22 is selected, the corresponding MOSFET 14 may be turned on. Therefore, the serially connected MTJ elements 30 are connected to the bit line 35 through the MOSFETS 14 and 54. In this configuration, in a read-out operation, the serially connected MTJ elements 30 are selected using the MOSFETS 14 and 54.

This second embodiment gives not only the effects similar to those of the first embodiment but also the following effects as well.

If, as by the first embodiment, a larger number of MTJ elements 30 are connected in series, the serial resistance of the column comprised of this plurality of MTJ elements 30 becomes large, to possibly deteriorate a read-out sensitivity. In contrast, by the second embodiment, a smaller number of MTJ elements 30 are connected in series to provide each of the pluralities of memory portions 51 and 52. The pluralities of thus formed memory portions 51 and 52 correspond to each bit line 35. It is, therefore, possible to prevent the read-out sensitivity from deteriorating.

Although the number of the MTJ elements 30 comprised in each of the memory portions 51 and 52 is not limited in particular, preferably it is four through eight taking into account the area of the memory cell array 10, a design lay-out, the read-out sensitivity, etc. If each of the memory portions 51 and 52 contains nine MTJ elements 30 or more, the read-out sensitivity deteriorates by at least one digit in some cases, so that mot preferably each of the memory portions 51 and 52 contains at most eight MTJ elements 30 as serially connected.

Third Embodiment

According to the third embodiment, in order to arrange a read-out switching element below an MTJ element, the gate electrode of the switching element is extended from the periphery of a memory cell array region to the inside thereof.

Figure 18:
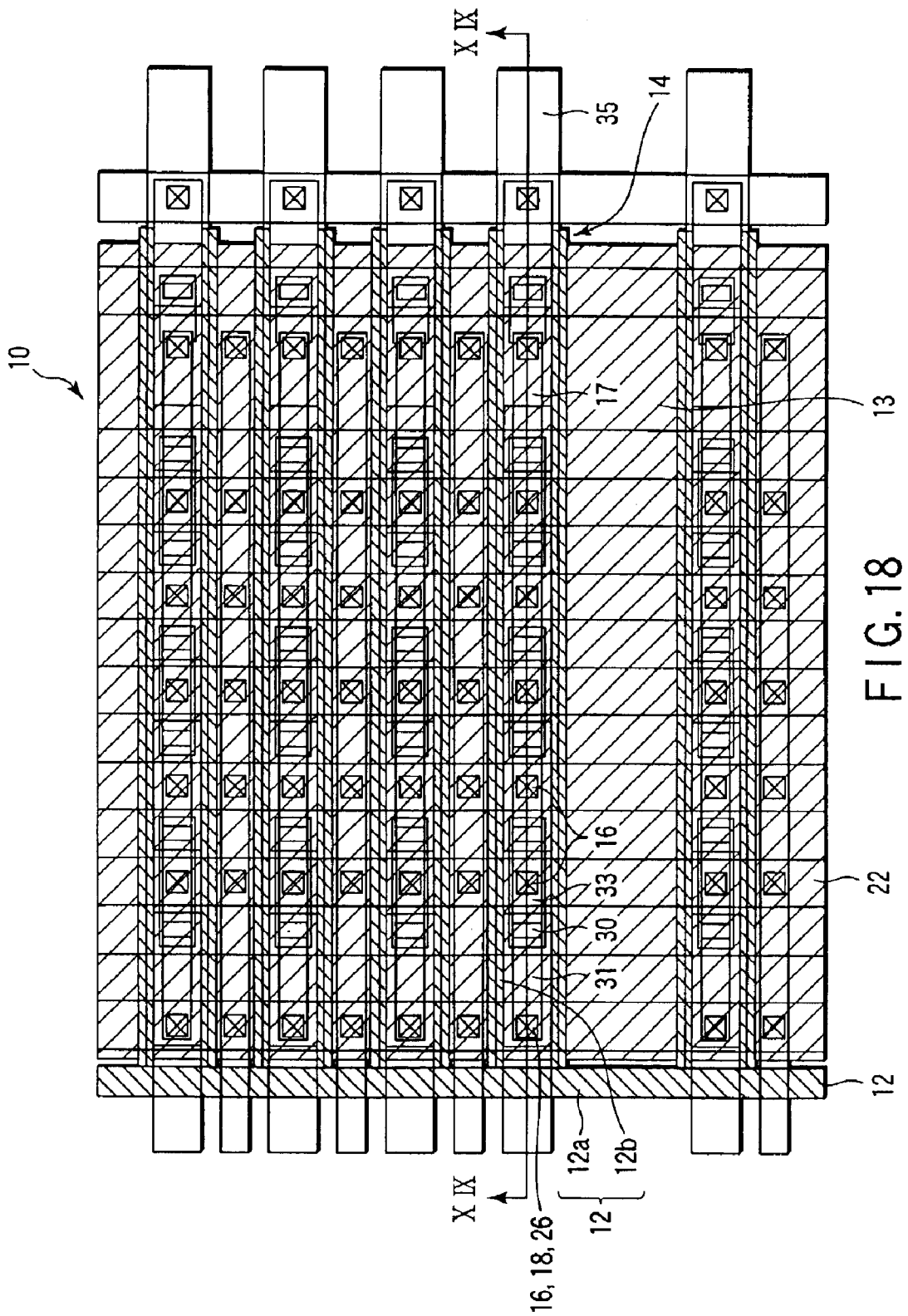
FIG. 18 is a plan view for showing a magnetic memory device related to a third embodiment of the invention.
Figure 19:
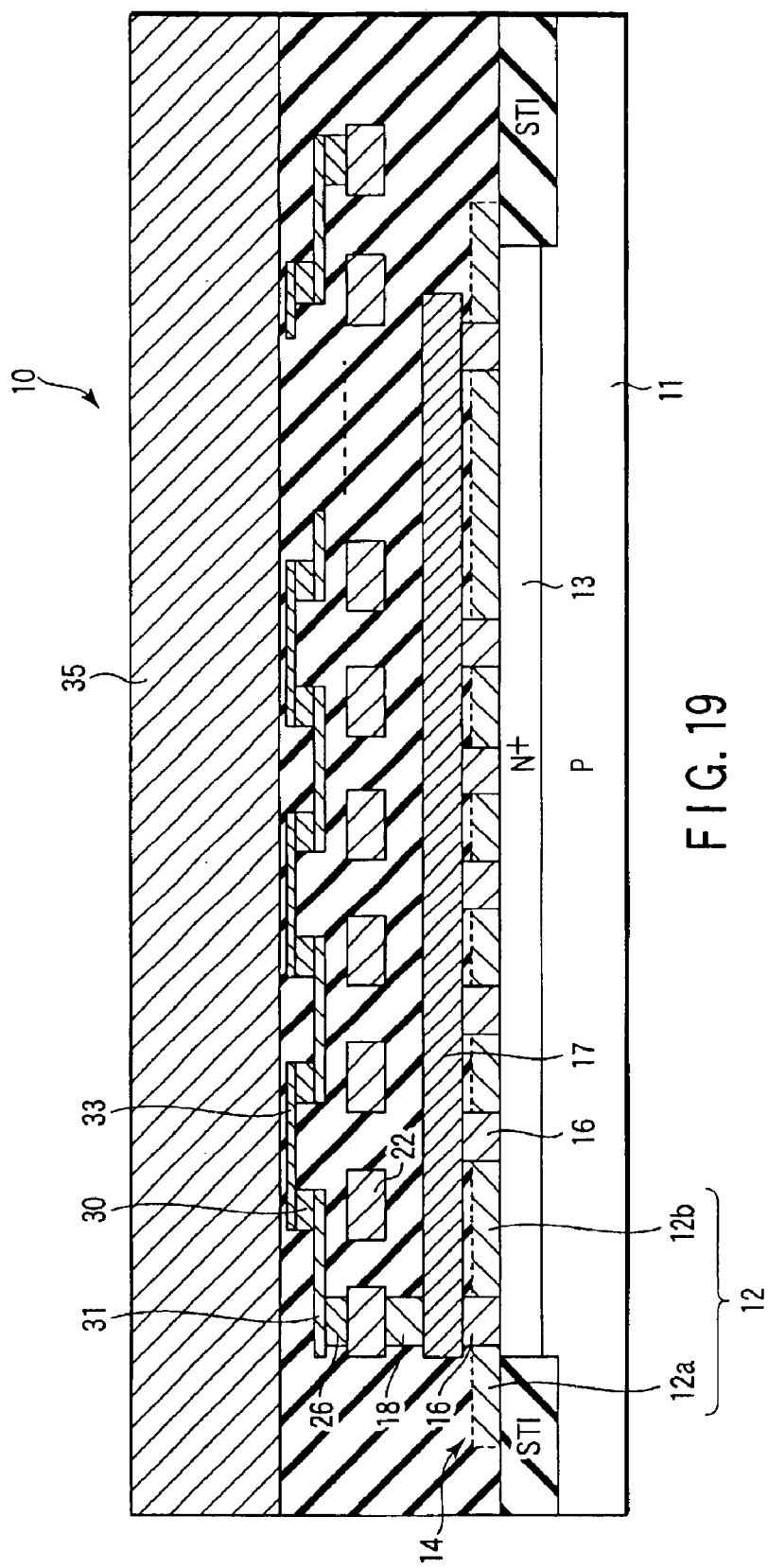
FIG. 19 is a cross-sectional view of the magnetic memory device taken along line XIX—XIX of FIG. 18.

FIG. 18 shows a plan view of a magnetic memory device related to the third embodiment of the invention. FIG. 19 shows a cross-sectional view of the magnetic memory device taken along line XIX—XIX of FIG. 18. The following will describe the structure of the magnetic memory device related to the third embodiment of the invention. It is to be noted that the description of the components of the present embodiment which are similar to those of the first embodiment is omitted.

As shown in FIGS. 18 and 19, the third embodiment differs from the first embodiment in that a gate electrode 12 of a MOSFET 14 is arranged to extend from the periphery of a memory cell array region 10 to an inside thereof. Specifically, the gate electrode 12 related to the third embodiment has a first gate electrode portion 12a extending in parallel with a word line 22 at the periphery of the memory cell array region 10 and a second gate electrode portion 12b extending in parallel with a bit line 35 inside the memory cell array region 10. These first and second gate electrode portions 12a and 12b are interconnected. On both sides of the second gate electrode portion 12b is there formed a source/drain diffusion layer 13 in a semiconductor substrate 11. Therefore, according to the third embodiment, below an MTJ element 30 are there present part of the date electrode 12 and the source/drain diffusion layer 13.

Furthermore, a first wiring 17 also extends in parallel with the bit line 35 inside the memory cell array region 10. To this first wiring 17 is there connected a first contact 16 between the MTJ elements 30. This first contact 16 is connected also to the source/drain diffusion layer 13. It is to be noted that the first contact 16 need not necessarily be arranged between the MTJ elements 30 but may be placed, for example, below the MTJ element 30.

The third embodiment gives almost the same effects as those by the first embodiment.

Furthermore, the third embodiment has formed the MOSFET 14 below the MTJ elements 30, thus effectively utilizing a region below the MTJ elements. It is, therefore, possible to further reduce an area occupied by the memory cell array region 10.

In addition, the third embodiment makes it possible to preserve a larger effective channel width of the MOSFET 14, thus giving an effect of increasing the magnitude of a read-out signal.

The third embodiment is applicable also to the structure of the second embodiment. In this case, it is possible to obtain the effects of both the second and third embodiments.

Fourth Embodiment

The fourth embodiment is a variant of the second embodiment. According to the fourth embodiment, between mutually adjacent cells, two MOSFETS share one of source/drain diffusion layers with each other in configuration.

Figure 20:
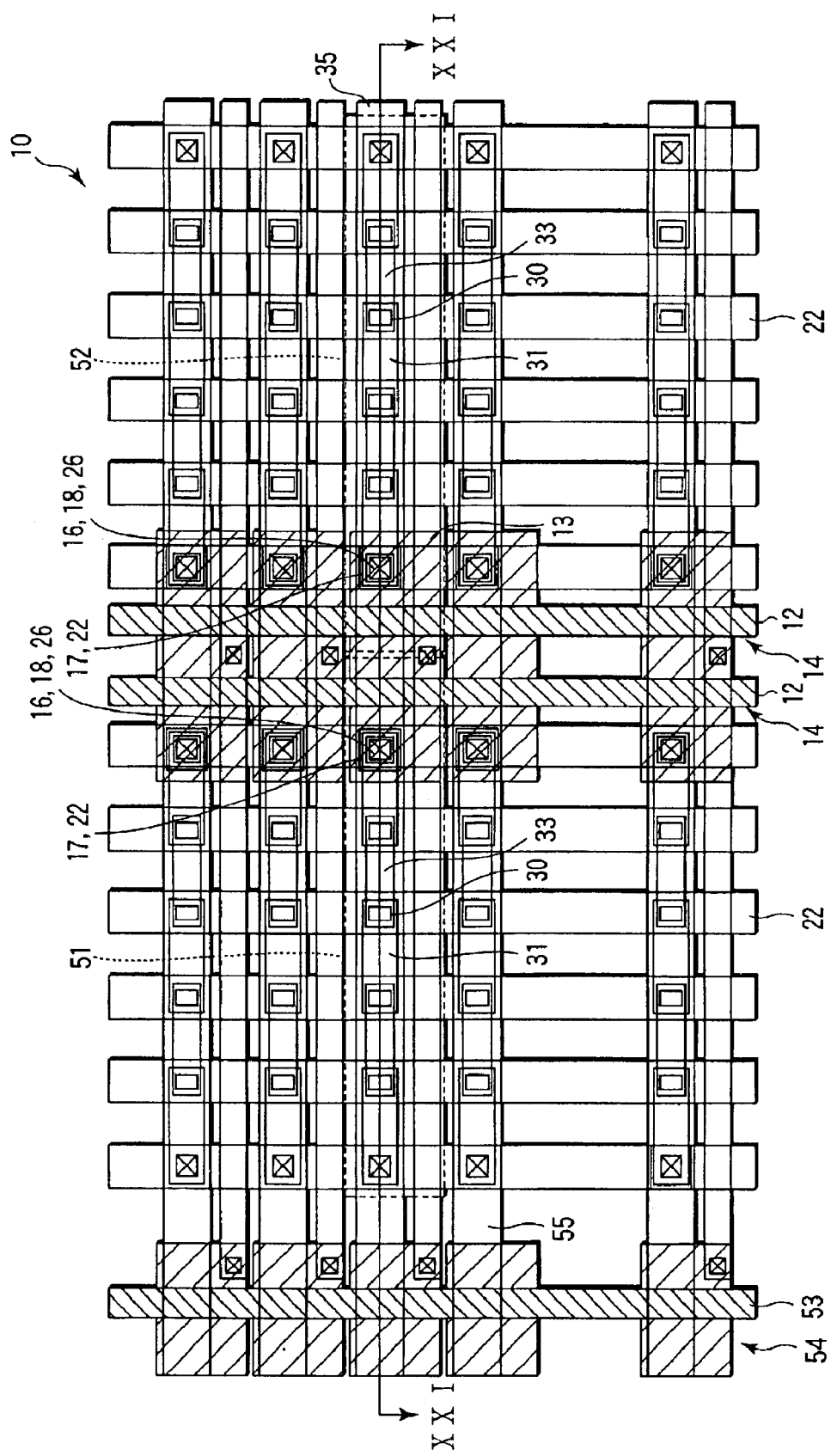
FIG. 20 is a plan view for showing a magnetic memory device related to a fourth embodiment of the invention.
Figure 21:
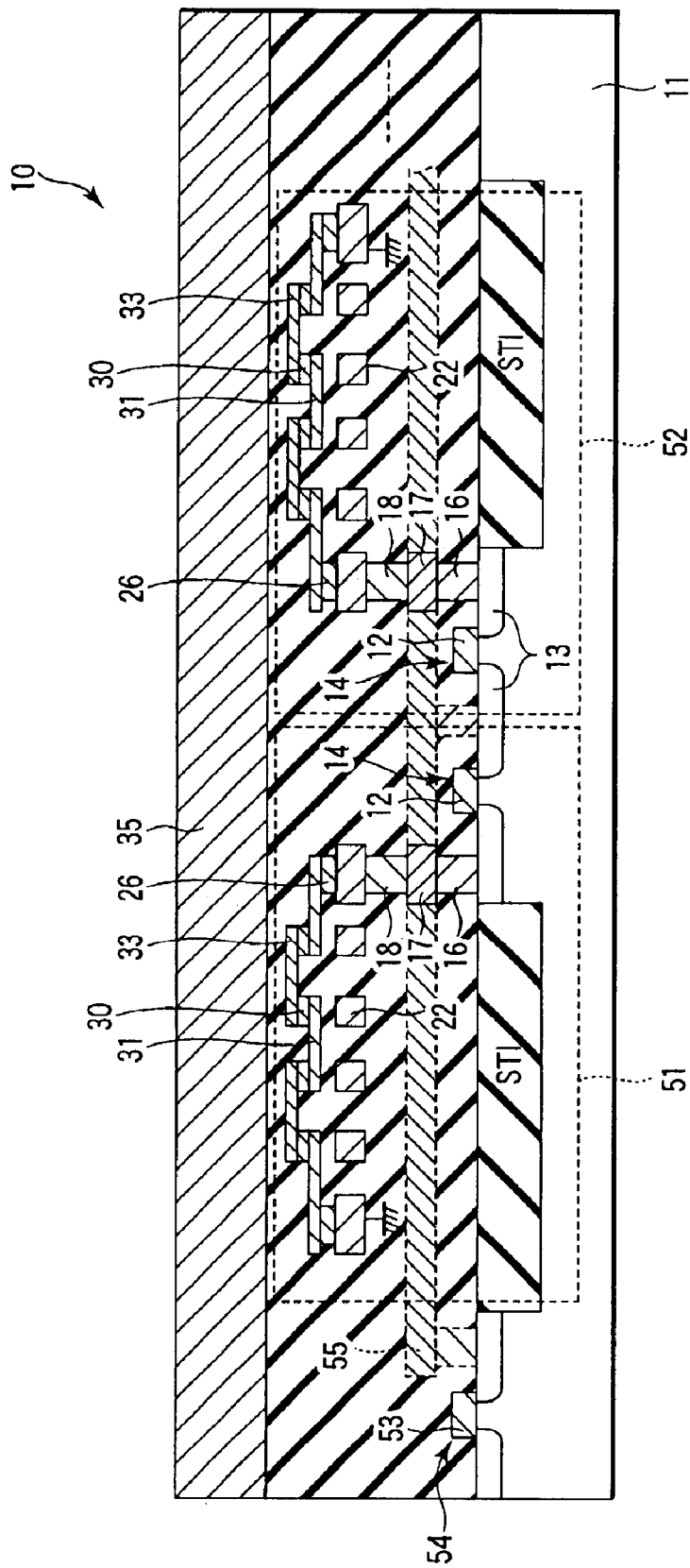
FIG. 21 is a cross-sectional view of the magnetic memory device taken along line XXI—XXI of FIG. 20.
Figures 22A, 22B, 22C:
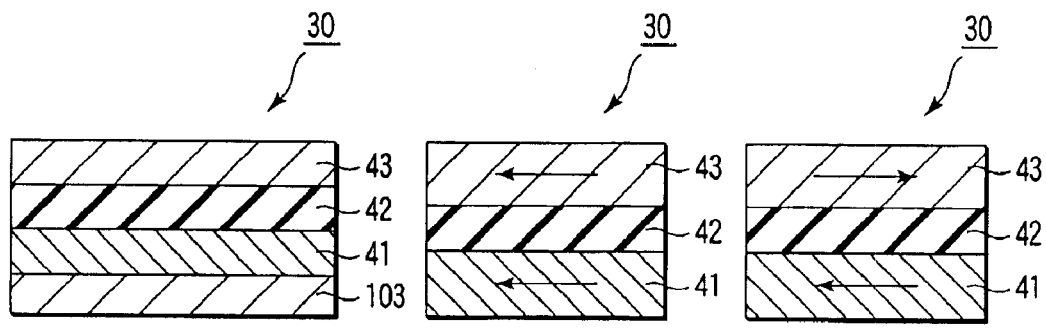
FIGS. 22A, 22B and 22C are cross-sectional views for showing an MTJ element according to a prior art.
Figure 23:
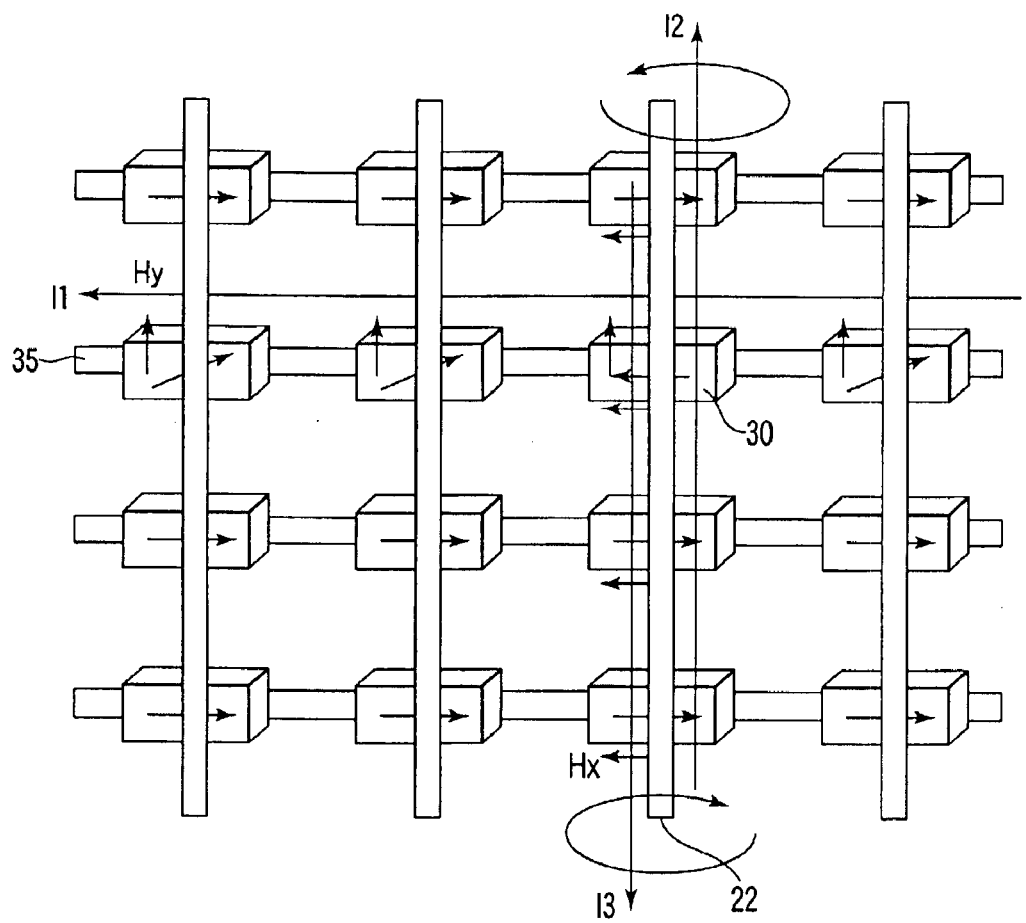
FIG. 23 is an illustration for showing the MTJ elements arranged in a matrix in the magnetic memory device according to the prior art.
Figure 24:
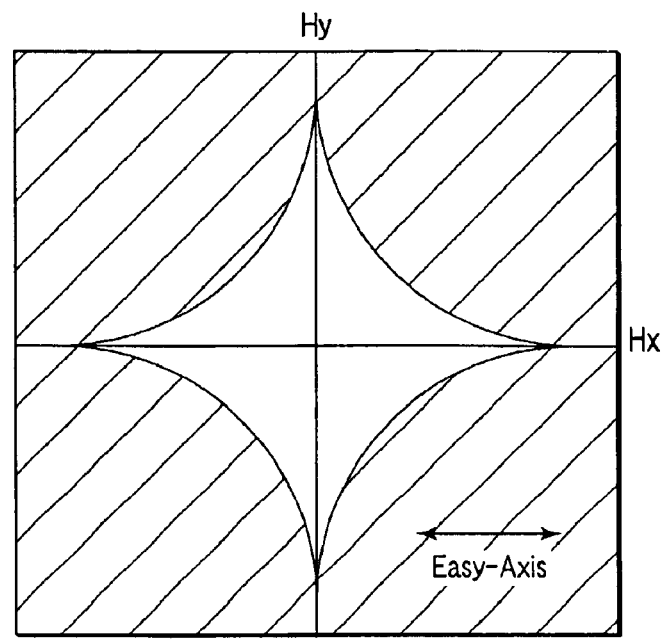
FIG. 24 is an illustration for showing an asteroid curve of the magnetic memory device according to the prior art.
Figure 25:
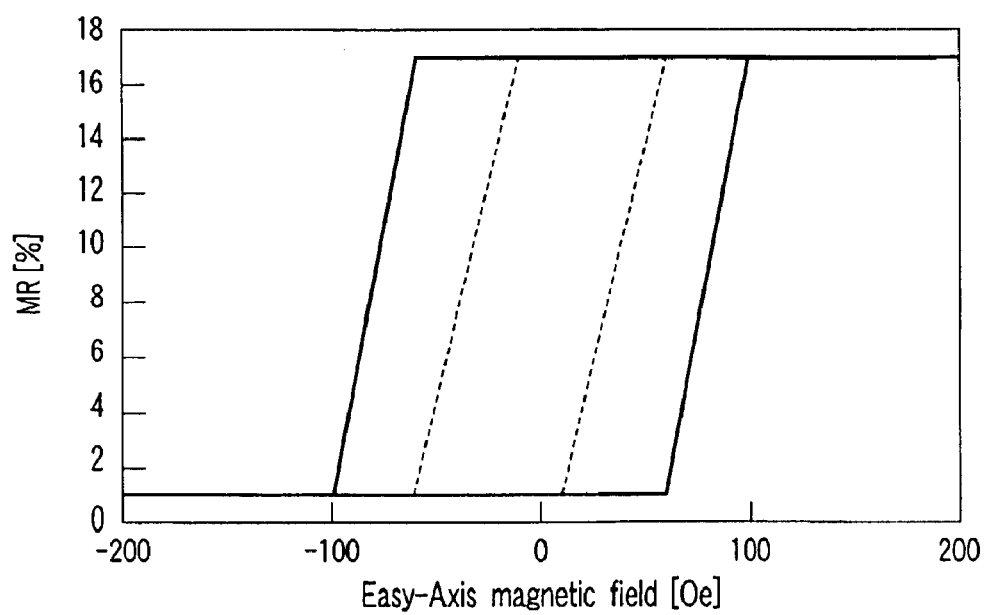
FIG. 25 is an illustration for showing a hysteresis curve of the magnetic memory device according to the prior art.
Figure 26:
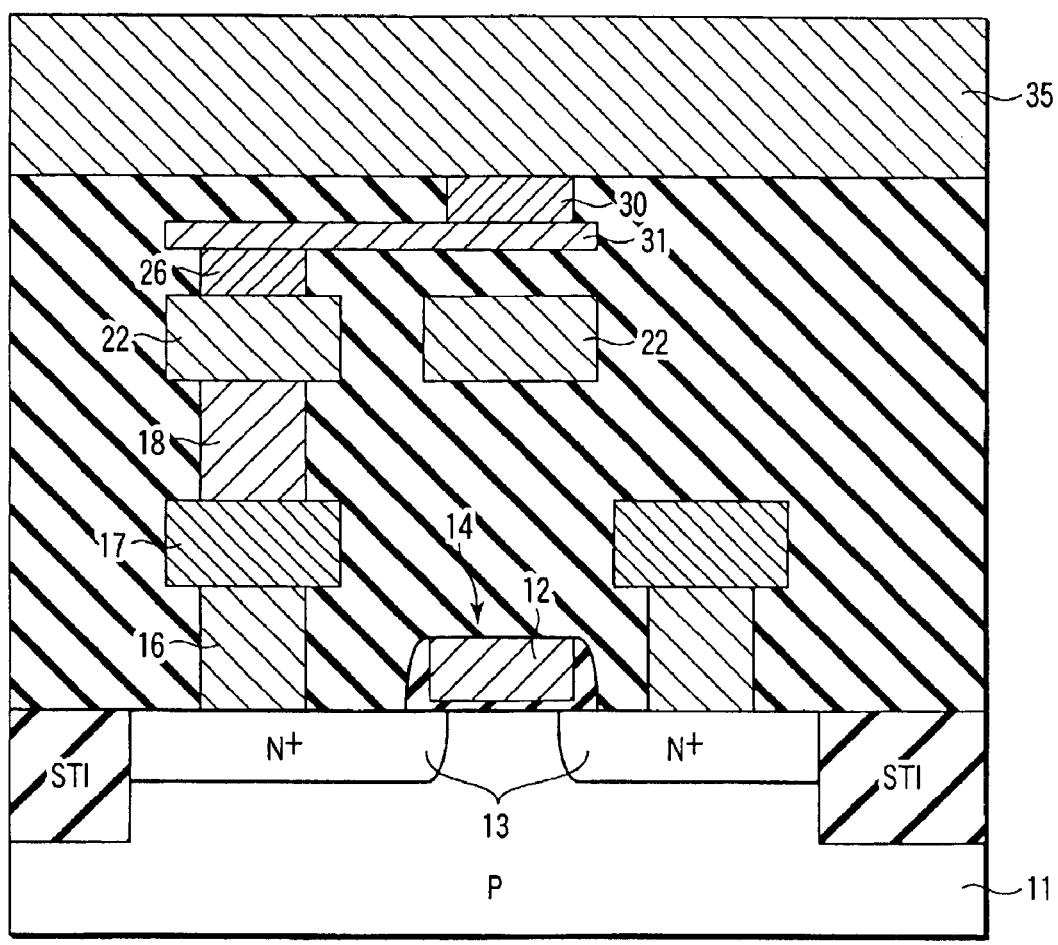
FIG. 26 is a cross-sectional view for showing a magnetic memory device provided with a transistor according to the prior art.
Figure 27:
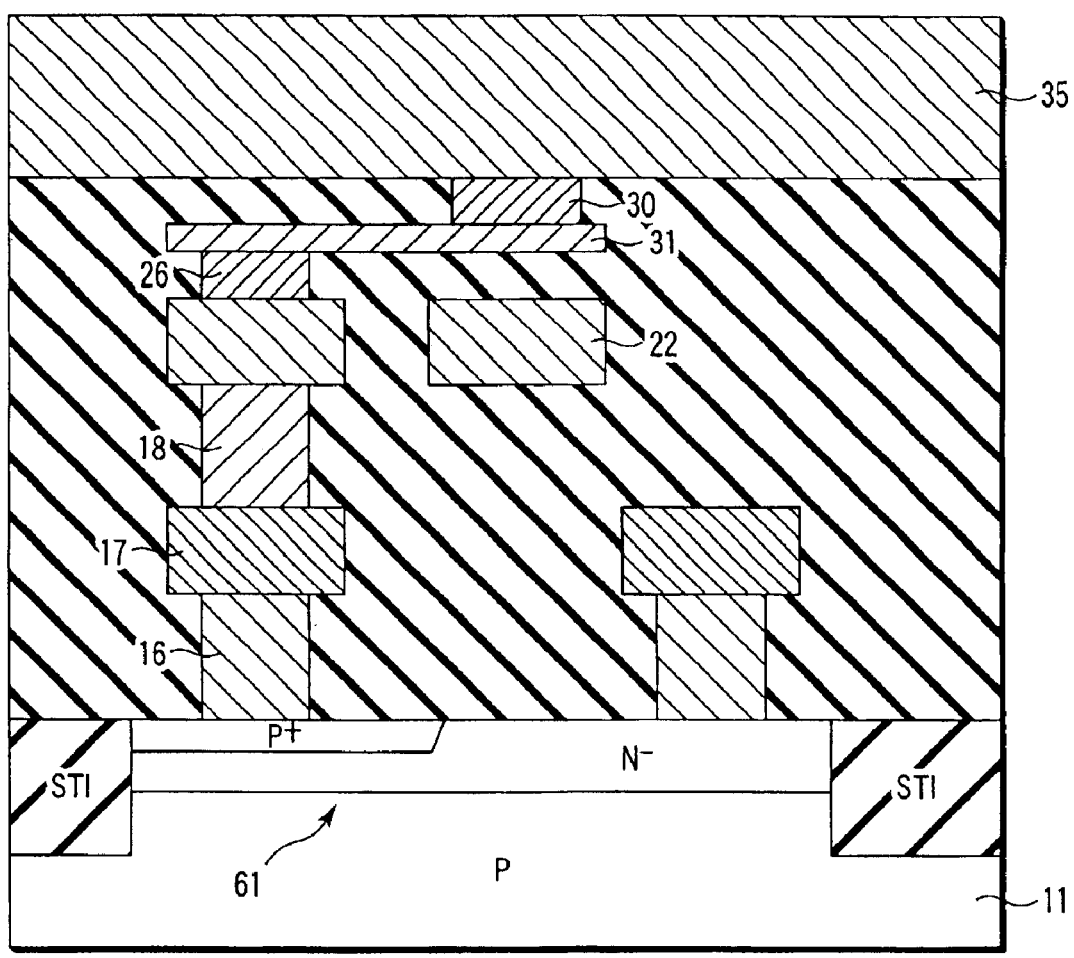
FIG. 27 is a cross-sectional view for showing a magnetic memory device provided with a diode according to the prior art.

FIG. 20 shows a plan view of a magnetic memory device related to the fourth embodiment of the invention. FIG. 21 shows a cross-sectional view of the magnetic memory device taken along line XXI—XXI of FIG. 20. The following will describe the structure of the magnetic memory device related to the fourth embodiment of the invention. It is to be noted that the description of the components of the present embodiment which are similar to those of the second embodiment is omitted.

As shown in FIGS. 20 and 21, the fourth embodiment is different from the second embodiment in that, between mutually adjacent memory portions 51 and 52, their respective MOSFETS 14 share one of the two source/drain diffusion layers 13 with each other. Therefore, on the side of a boundary between the mutually adjacent memory portions 51 and 52 are there arranged their respective MOSFETS 14. To the common portion of the source/drain diffusion layer 13 is there connected a MOSFET 54 via a contact.

This fourth embodiment gives almost the same effects as those by the second embodiment.

Furthermore, since the mutually adjacent cells share part of the switching elements in common thereto in the fourth embodiment, it is possible to reduce an area occupied by the memory cell array region 10 than by the second embodiment.

Furthermore, the structure of the third embodiment can be applied to the fourth embodiment. In this case, it is possible to obtain the effects of both the third and fourth embodiments.

Furthermore, although the above-mentioned embodiments have employed a transistor as the switching element, a diode may be used instead of the transistor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
a first memory portion, said first memory portion including:
  a first wiring extending in a first direction;
  a plurality of second wirings extending in a second direction different from said first direction;
  a first memory element portion in which a plurality of magneto-resistance elements is connected to each other in series and arranged between said first wiring and said second wirings at intersections between said first wiring and said second wirings as separated from said first wiring and said second wirings respectively; and
  a first switching element connected to one end of said first memory element portion; and
a second memory portion which is adjacent to said first memory portion in said first direction and shares said first wiring with said first memory portion, said second memory portion including:
  said first wiring;
  a plurality of third wirings extending in said second direction;
  a second memory element portion in which said magneto-resistance elements are connected to each other in series and arranged between said first wiring and said third wirings at intersections between said first wiring and said third wirings as separated from said first wiring and said third wirings respectively; and
  a second switching element connected to one end of said second memory element portion.

2. The magnetic memory device according to claim 1, wherein:
said first memory element portion contains a first magneto-resistance element, a second magneto-resistance element and a third magneto-resistance element, and said second and third magneto-resistance elements are adjacent to said first magneto-resistance element respectively;

said first through third magneto-resistance elements each have a first end opposed to said first wiring and a second end opposed to said second wirings;

said first end of said first magneto-resistance element is connected to said first end of said second magneto-resistance element;

said second end of said first magneto-resistance element is connected to said second end of said third magneto-resistance element;

said second memory element portion contains a fourth magneto-resistance element, a fifth magneto-resistance element and a sixth magneto-resistance element, and said fifth and sixth magneto-resistance elements are adjacent to said fourth magneto-resistance element respectively;

said fourth through sixth magneto-resistance elements each have a third end opposed to said first wiring and a fourth end opposed to said third wirings;

said third end of said fourth magneto-resistance element is connected to said third end of said fifth magneto-resistance element; and said fourth end of said fourth magneto-resistance element is connected to said fourth end of said sixth magneto-resistance element.

3. The magnetic memory device according to claim 1, wherein said magneto-resistance elements are serially connected in parallel with a surface of a semiconductor substrate.

4. The magnetic memory device according to claim 1, wherein there is also comprised an element isolating insulation film provided below said first and second memory element portions.

5. The magnetic memory device according to claim 1, wherein said first wiring and said second wirings cross each other perpendicularly, while said first wiring and said third wirings also cross each other perpendicularly.

6. The magnetic memory device according to claim 1, wherein said magneto-resistance elements each are an MTJ element comprising at least a first magnetic layer, a second magnetic layer, and a nonmagnetic layer.

7. The magnetic memory device according to claim 6, wherein said MTJ element has either a single tunnel junction structure or a double tunnel junction structure.

8. The magnetic memory device according to claim 1, wherein the number of said magneto-resistance elements contained in each of said first and second memory element portions is four through eight.

9. The magnetic memory device according to claim 1, wherein there is further comprised a third switching element connected to said first and second switching elements.

10. The magnetic memory device according to claim 9, wherein said third switching element is arranged at a periphery of a memory cell array region where said first and second memory element portions are present.

11. The magnetic memory device according to claim 1, wherein said first switching element is arranged below said first memory element portion, while said second switching element is arranged below said second memory element portion.

12. The magnetic memory device according to claim 1, wherein said first and second switching elements each are a transistor.

13. The magnetic memory device according to claim 12, wherein said transistor includes:

a first gate electrode which is arranged at a periphery of a memory cell array region where said first and second memory element portions are present and which extends in said second direction; and a second gate electrode which is connected to said first gate electrode and which extends in said first direction from said periphery into said memory cell array region.

14. The magnetic memory device according to claim 1, wherein said first and second memory portions share part of said first switching element and part of said second switching element with each other.

15. The magnetic memory device according to claim 14, wherein:

said first and second switching elements each are a transistor; and said first and second memory portions share part of a diffusion layer of said transistor with each other.

16. The magnetic memory device according to claim 14, wherein said first and second switching elements are arranged on a side of a boundary between said first and second memory portions.

17. The magnetic memory device according to claim 1, wherein a method for reading out data from an arbitrary magneto-resistance element in said first memory element portion comprises:

detecting a first current which flows through a serial resistor of said first memory element portion when data is written to said arbitrary magneto-resistance element;

detecting a second current which flows through said serial resistor of said first memory element portion when said data is written to said arbitrary magneto-resistance element again; and comparing said first and second currents to each other in magnitude to read out said data written to said arbitrary magneto-resistance element.

18. The magnetic memory device according to claim 1, wherein to read out data from an arbitrary magneto-resistance element in said first memory element portion, said first wiring is selected using said first switching element.

19. The magnetic memory device according to claim 9, wherein to read out data from an arbitrary magneto-resistance element in said first memory element portion, said first memory element portion is selected using said first and third switching elements.

20. A magnetic memory device manufacturing method comprising:

forming a first switching element on a semiconductor substrate;

forming a plurality of first wirings extending in a first direction above said semiconductor substrate;

forming a first insulation film on said first wirings;

forming a first memory element portion in which a plurality of magneto-resistance elements is connected in series on said first insulation film above said first wirings, to connect one end of said first memory element portion to said first switching element;

forming a second insulation film on said first memory element portion; and forming a second wiring extending in a second direction different from said first direction on said second insulation film above said first memory element portion.

21. The magnetic memory device manufacturing method according to claim 20, wherein said magneto-resistance elements are serially connected in parallel with a surface of said semiconductor substrate.

22. The magnetic memory device manufacturing method according to claim 20, wherein an element isolating insulation film is formed in said semiconductor substrate below said first memory element portion.

23. The magnetic memory device manufacturing method according to claim 20, wherein said magneto-resistance elements each are an MTJ element comprising at least a first magnetic layer, a second magnetic layer, and a non-magnetic layer.

24. The magnetic memory device manufacturing method according to claim 20, further comprising:

forming a second memory portion which is adjacent to a first memory portion in said second direction and shares said second wiring with said first memory portion at the same time as forming said first memory portion, said first memory portion including said first memory element portion, said first switching element, and said first and second wirings, said second memory portion including a second memory element portion in which said magneto-resistance elements are connected in series, a second switching element connected to one end of said second memory element portion, said second wiring, and a plurality of third wirings extending in said first direction.

25. The magnetic memory device manufacturing method according to claim 20, wherein said first switching element is formed below said first memory element portion.

26. The magnetic memory device manufacturing method according to claim 20, wherein said first switching element is a transistor.

27. The magnetic memory device manufacturing method according to claim 26, wherein said transistor includes:

a first gate electrode which is arranged at a periphery of a memory cell array region in which said first memory element portion is present and which extends in said first direction; and a second gate electrode which is connected to said first gate electrode and which extends in said second direction from said periphery into said memory cell array region.

28. The magnetic memory device manufacturing method according to claim 24, wherein said first and second switching elements are formed in such a manner that part of said first switching element and part of said second switching element may be shared by said first and second memory portions.

29. The magnetic memory device manufacturing method according to claim 28, wherein:

said first and second switching elements each are a transistor; and part of a diffusion layer of said transistor is shared by said first and second memory portions.

30. The magnetic memory device manufacturing method according to claim 28, wherein said first and second switching elements are formed on a side of a boundary between said first and second memory portions.

* * * * *